US006730950B1

(12) United States Patent
Seshadri et al.

(10) Patent No.: US 6,730,950 B1
(45) Date of Patent: May 4, 2004

(54) LOCAL INTERCONNECT USING THE ELECTRODE OF A FERROELECTRIC

(75) Inventors: Anand Seshadri, Plano, TX (US); Jarrod R. Eliason, Colorado Springs, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/337,581

(22) Filed: Jan. 7, 2003

(51) Int. Cl.[7] ................................................ H01L 29/72
(52) U.S. Cl. ........................ 257/295; 257/296; 257/301; 257/303; 257/311; 257/532; 257/535
(58) Field of Search ................................. 257/295, 296, 257/301, 303, 311, 532, 535

(56) References Cited

U.S. PATENT DOCUMENTS

| | | | |
|---|---|---|---|
| 6,140,672 A | 10/2000 | Arita et al. | |
| 6,256,220 B1 | 7/2001 | Kamp | |
| 6,396,158 B1 | 5/2002 | Travis et al. | |
| 6,442,060 B1 | 8/2002 | Leung et al. | |
| 6,611,014 B1 | * | 8/2003 | Kanaya ....................... 257/295 |

OTHER PUBLICATIONS

"A Survey of Circuit Innovations in Ferroelectric Random-Access Memories", Ali Sheikholesi and P. Glenn Gulak, Proceedings of the IEEE, vol. 88, No. 5, May 2000, pp. 667–689.

* cited by examiner

Primary Examiner—Edward Wojciechowicz
(74) Attorney, Agent, or Firm—Jacqueline J. Garner; W. James Brady, III; Frederick J. Telecky, Jr.

(57) ABSTRACT

Ferroelectric device structures are provided comprising a ferroelectric capacitor, first and second circuit elements, and first and second contacts. The ferroelectric capacitor residing over the first and second circuit elements, and first and second contacts, has a conductive plate that may be used as a local interconnect layer. The conductive plate extends between and electrically couples first and second circuit elements directly through first and second contacts of the ferroelectric memory device. Methods are also provided for forming the local interconnect layer within the conductive plate of the ferroelectric capacitor.

7 Claims, 9 Drawing Sheets

FIG. 10A  FIG. 10B

LOCAL INTERCONNECT USING THE ELECTRODE OF A FERROELECTRIC

FIELD OF INVENTION

The present invention relates generally to semiconductor memory devices and more particularly to memory structures and methods for forming a local interconnect layer within a conductive plate of a ferroelectric capacitor in a ferroelectric memory device.

BACKGROUND OF THE INVENTION

In semiconductor memory devices, data is read from or written to the memory using address signals and various other control signals. In a random access memory ("RAM"), an individual binary data state (e.g., a bit) is stored in a volatile memory cell, wherein a number of such cells are grouped together into arrays of columns and rows accessible in random fashion along bitlines and wordlines, respectively, wherein each cell is associated with a unique wordline and bitline pair. Address decoder control circuits identify one or more cells to be accessed in a particular memory operation for reading or writing, wherein the memory cells are typically accessed in groups of bytes or words (e.g., generally a multiple of 8 cells arranged along a common wordline). Thus, by specifying an address, a RAM is able to access a single byte or word in an array of many cells, so as to read or write data from or into that addressed memory cell group.

Two major classes of random access memories include "dynamic" (e.g., DRAMs) and "static" (e.g., SRAMs) devices. For a DRAM device, data is stored in a capacitor, where an access transistor gated by a wordline selectively couples the capacitor to a bit line. DRAMs are relatively simple, and typically occupy less area than SRAMs. However, DRAMs require periodic refreshing of the stored data, because the charge stored in the cell capacitors tends to dissipate. Accordingly DRAMs need to be refreshed periodically in order to preserve the content of the memory. SRAM devices, on the other hand, do not need to be refreshed. SRAM cells typically include several transistors configured as a flip-flop having two stable states, representative of two binary data states. Since the SRAM cells include several transistors, however, SRAM cells occupy more area than do DRAM cells. However, SRAM cells operate relatively quickly and do not require refreshing and the associated logic circuitry for refresh operations.

A major disadvantage of SRAM and DRAM devices is volatility, wherein removing power from such devices causes the data stored therein to be lost. For instance, the charge stored in DRAM cell capacitors dissipates after power has been removed, and the voltage used to preserve the flip-flop data states in SRAM cells drops to zero, by which the flip-flop loses its data. Accordingly, SRAMs and DRAMs are commonly referred to as "volatile" memory devices. Non-volatile (NV) memories are available, such as Flash and EEPROM. However, these types of non-volatile memory have operational limitations on the number of write cycles. For instance, Flash memory devices generally have life spans from 100K to 10MEG write operations.

Recently however, non-volatile ferroelectric RAM devices have been developed, which are commonly referred to as FERAMs or FRAMs. FERAM cells employ ferroelectric capacitors (FECaps) including a pair of capacitor plates with a ferroelectric material, such as SBT or PZT, as the capacitor dielectric situated between them. Ferroelectric materials have two different stable polarization states that may be used to store binary information, where the ferroelectric behavior follows a hysteresis curve of polarization versus applied voltage. FERAM memory cells are non-volatile memory devices, because the polarization state of an FECap remains when power is removed from the device.

Two types of memory cells are used commonly, a single capacitor memory cell and a dual capacitor memory cell. The single capacitor memory cell (referred to as a 1T/1C or 1C memory cell) requires less silicon area (thereby increasing the potential density of the memory array), but is less immune to noise, process and cycling variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell generally is more stable than a 1C memory cell.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the drive line DL or plate line PL) 19. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently, the sense amplifier reference voltage is provided by a "reference cell", which comprises a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. Since the polarization of the ferroelectric is switched, the read operation is destructive and the sense amplifier must rewrite (onto that cell) the correct polarization value as the bit just read from the cell. This is similar to the operation of a DRAM. One difference from a DRAM is that a ferroelectric memory cell will retain its state until it is interrogated, thereby eliminating the need of refresh.

As illustrated, for example, in prior art FIG. 2, a 2T/2C memory cell 20 in a memory array couples to a bit line 22 and an inverse of the bit line ("bit line-bar") 24 that is common to many other memory types (for example, static random access memories). Memory cells of a memory block are formed in memory rows and memory columns. The dual capacitor ferroelectric memory cell comprises two transistors 26 and 28 and two ferroelectric capacitors 30 and 32, respectively. The first transistor 26 couples between the bit line 22 and a first capacitor 30, and the second transistor 28 couples between the bit line-bar 24 and the second capacitor 32. The first and second capacitors 30 and 32 have a common terminal or plate line PL 34 to which a signal is applied for polarizing the capacitors.

In a write operation, the first and second transistors 26 and 28 of the dual capacitor ferroelectric memory cell 20 are enabled (e.g., via their respective word line WL 36) to couple the capacitors 30 and 32 to the complementary logic levels on the bit line 22 and the bar-bar line 24 corresponding to a logic state to be stored in memory. The common terminal 34 of the capacitors is pulsed during a write operation to polarize the dual capacitor memory cell 20 to one of the two logic states.

In a read operation, the first and second transistors 26 and 28 of the dual capacitor memory cell 20 are enabled via the word line 36 to couple the information stored on the first and second capacitors 30 and 32 to the bit line 22 and the bit line-bar line 24, respectively. A differential signal (not shown) is thus generated across the bit line 22 and the bit line-bar line 24 by the dual capacitor memory cell 20. The differential signal is sensed by a sense amplifier (not shown) that provides a signal corresponding to the logic level stored in memory.

Ferroelectric memory cells employing these FECaps provide certain performance advantages over other forms of non-volatile data storage devices, such as Flash and EEPROM type memories. For example, ferroelectric memories offer short programming (e.g., write access) times and low power consumption and lower voltage operation.

Several additional memory devices have been developed utilizing FECaps, such as the four transistor (4T) two capacitor (2C) non-volatile (NV) SRAM cell (4T/2C NV SRAM), and the FECap based reference cell noted above. In these NV FERAM devices, the FECap is commonly coupled to several (e.g., 3–5) MOS transistors or other such memory circuit elements through contacts and vias to the metal layer (e.g., M1) for interconnection. However, as device densities and memory speed requirements continue to increase, the M1 metal layer tends to become increasing crowded and may limit the layout area available, particularly for the memory cells. In addition, the area and length required by the interconnection contacts and vias coupling the circuit elements to the M1 layer, further limits the layout area, the size of the FECaps, and the minimum resistance between the interconnected circuit elements. Accordingly, there is a need for an improved memory structure for interconnecting a non-volatile ferroelectric capacitor with associated circuit elements in a ferroelectric device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention relates to an improved ferroelectric device structure and methods for forming a local interconnect layer with a conductive plate of a ferroelectric capacitor in a ferroelectric device. The device comprises a ferroelectric capacitor and a plurality of circuit elements, which are locally interconnected using the metal or otherwise conductive layer formed from one of the conductive plates of the ferroelectric capacitor. In various ferroelectric circuits that use an FECap, the FECap is required to electrically couple to several MOS transistors or other such circuit elements. Typically, this interconnection is done by routing through a contact and/or via from the FECap down to the circuit element in an active region, then back up through the M1 layer interconnect layer, then finally back down again to multiple circuit elements thru respective contacts and/or vias associated with respective circuit elements. This extensive use of the M1 tends to crowd the M1 and may limit layout density.

By contrast, the present invention uses a plate of the ferroelectric capacitor as a local interconnection layer for multiple circuit elements, rather than using the M1. Although the invention is described and illustrated in exemplary circuits and structures using the bottom electrode of the FECap, it is anticipated that either the top or bottom electrodes of the FECap may be used as the local interconnection layer for the purpose of interconnecting multiple circuit elements. It is further anticipated that both the top and bottom electrodes may be used as local interconnection layers for interconnecting various combinations of multiple circuit elements and multiple segments of one or more metal layers such as the M1 layer. Circuit elements may include, for example, active regions such as the source, drain or gate of a MOS transistor or other such circuit elements in or on a semiconductor substrate. It should be noted, however, that the use of the term "substrate" herein, includes the base semiconductor wafer and any epitaxial layers or other type semiconductor layers formed thereover or associated therewith.

The present invention, therefore, takes advantage of the increased FECap surface area required in the layout to interconnect the FECap to the various circuit elements. In addition, the total overall length of the interconnections is shorter in this interconnection structure and scheme, in part, because the interconnection vias are shorter. Manufacturability is also improved due to a reduced number of vias and interconnects. Further, the layout area or layout complexity is reduced in the present invention, as the FECap surface area is unbroken by the area required for contacts and/or vias between the selected circuit elements and the M1 layer.

The ferroelectric memory device of the instant invention is beneficially adapted to provide an additional interconnection layer (local interconnect layer) between multiple circuit elements. As such, the inventor has realized that when the scheme is applied to memory devices requiring larger numbers of interconnections, more benefits of the invention may be derived. The ferroelectric memory device of the present invention comprises first and second circuit elements associated with the ferroelectric memory device, and a ferroelectric capacitor having a conductive plate residing over a first interlevel dielectric layer (ILD). The plate (e.g., top or bottom electrode) of the FECap extends between the first and second circuit elements, providing a local interconnect layer for electrically coupling the first circuit element to the conductive plate directly through a first via, and electrically coupling a second circuit element to the conductive plate directly through a second via, thereby electrically coupling together the circuit elements of the memory device.

The FECap local interconnect layer may be any form or type of conductive plate material used in the ferroelectric capacitor, where the plate forms an integral part of the electrical coupling path between two or more interconnected circuit elements. The FECap local interconnect layer may be used in numerous exemplary FERAM devices, such as the four transistor two capacitor non-volatile SRAM cell (4T/2C NV SRAM), the non-volatile FECap based reference cell, and any other device which requires that an FECap interconnect with two or more circuit elements. For example, one 4T/2C NV SRAM cell requires that each FECap interconnect with three other circuit elements, such as three active regions of three MOS transistors. In another example, a non-volatile reference cell requires that an FECap interconnect with five other circuit elements, such as five active regions of five MOS transistors.

Another aspect of the present invention provides an FECap comprising a first and second conductive plate, where the plates have about the same capacitive surface shape and surface area in the FECap. Beneficially, this provision provides for a formation method in accordance with the present invention, requiring no additional processing in a ferroelectric memory device, (e.g., masking, etching operations). Still another aspect of the present invention provides the FECap comprising a capacitor under bitline architecture.

Another aspect of the invention provides a memory device for storing data in a semiconductor device, which comprises an SRAM memory cell and ferroelectric cell including first and second coupling transistors, first and second access transistors, first and second bitlines, a wordline, and first and second ferroelectric capacitors and which is adapted to store a binary non-volatile data state.

Still another aspect of the invention provides methods for forming a FECap in a FERAM device, in which a plurality of circuit elements associated with the FERAM device in a semiconductor material are provided and individually coupled to one of a plurality of contacts formed over the circuit elements and through openings in a first ILD layer overlying the plurality of circuit elements. The FECap formation method also comprises forming a bottom electrode layer, a ferroelectric dielectric layer, a top electrode layer, and a hard mask over the first ILD layer and the plurality of contacts associated with the circuit elements, and patterning the hard mask layer extending over the plurality of contacts. The FECap formation method further includes selectively etching the bottom electrode layer, the ferroelectric dielectric layer, and the top electrode layer using the hard mask to define a capacitor stack residing over the first ILD layer, where the stack extends between the plurality of contacts and electrically couples together the plurality of circuit elements of the device through the plurality of contacts.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 10A is a schematic diagram illustrating another exemplary interconnection between an FECap ($C_{FE}$) and a plurality of memory circuit elements E1–En, and between $C_{FE}$ and a plurality of segments M1a–M1n of a metal layer of a memory device in accordance with an aspect of the present invention;

FIG. 10B is a fragmentary cross-sectional view of the partially fabricated memory device of FIG. 10A, comprising a ferroelectric capacitor FECap $C_{FE}$, a plurality of memory circuit elements E1–En and a plurality of vias associated therewith, and a plurality of segments M1a–M1n of a metal layer and a plurality of contacts associated therewith, illustrating an exemplary local interconnect structure in accordance with an aspect of the present invention.

DETAILED DESCRIPTION OF THE INVENTION

Figure 1:
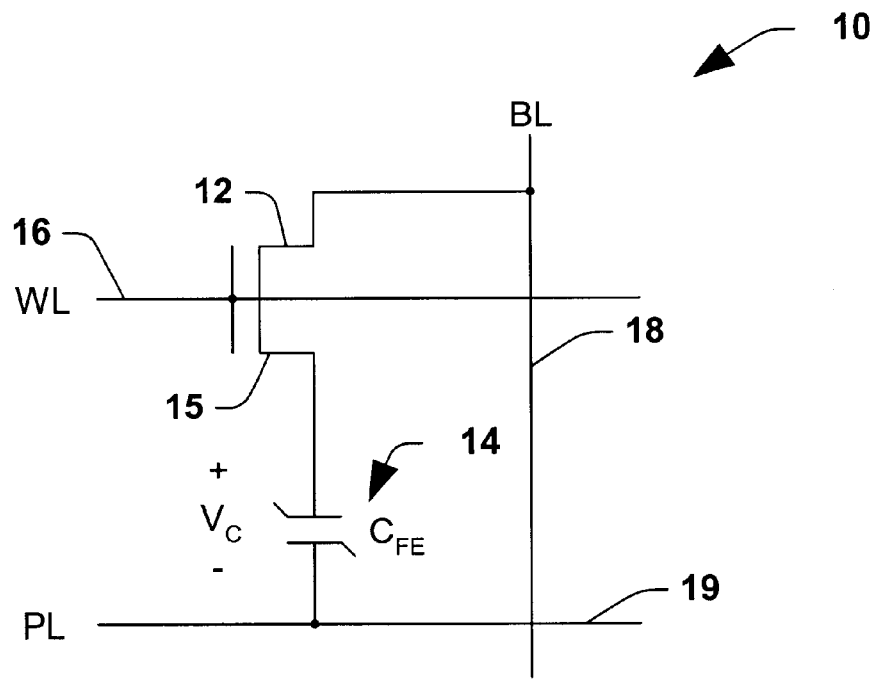
FIG. 1 is a prior art schematic diagram illustrating an exemplary 1T/1C FeRAM memory cell.
Figure 2:
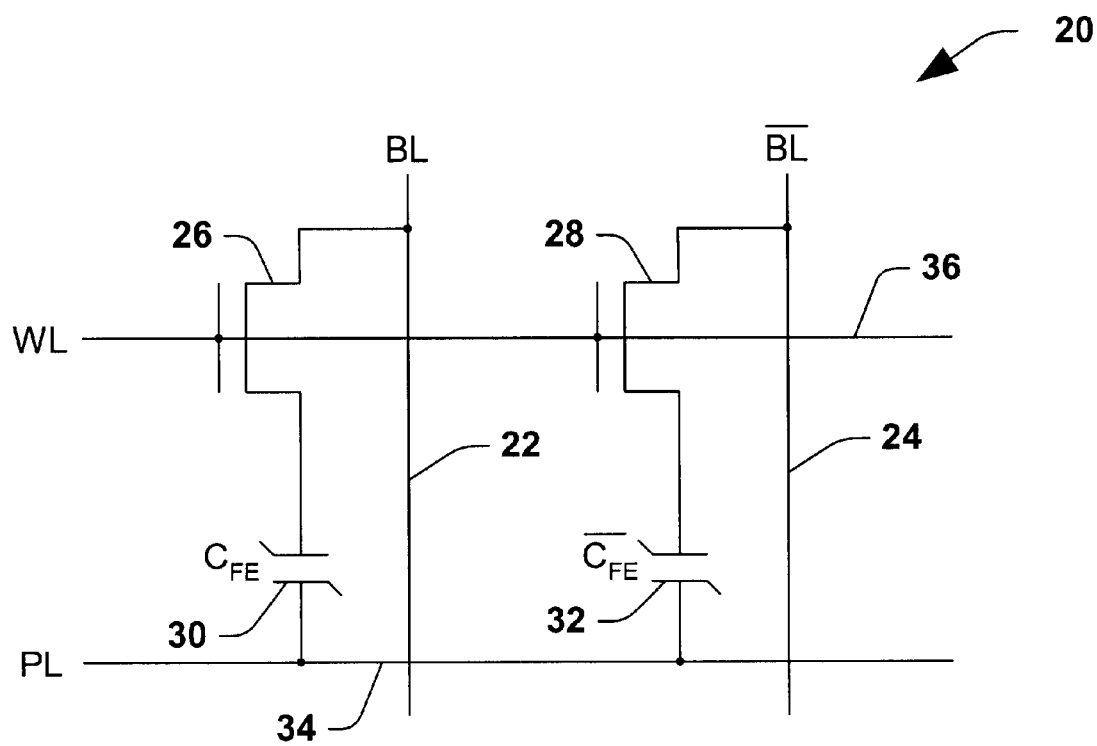
FIG. 2 is a prior art schematic diagram illustrating an exemplary 2T/2C FeRAM memory cell.

The present invention will now be described with reference to the attached drawings, wherein like reference numerals are used to refer to like elements throughout. The invention relates to a ferroelectric memory structure in which a local interconnect layer is formed within a conductive plate of a ferroelectric capacitor used in a ferroelectric memory device. In order to better appreciate one or more features of the invention, a conventional ferroelectric memory device and an associated interconnect is hereinafter illustrated and described with respect to FIG. 3A.

Figure 3A:
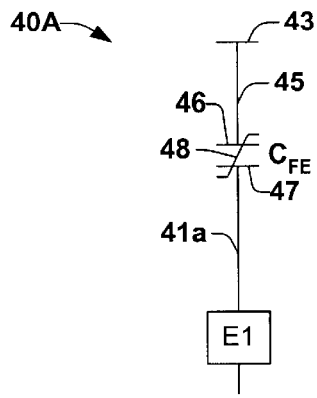
FIG. 3A is a prior art schematic diagram of a memory device illustrating an exemplary interconnection between an FECap ($C_{FE}$) and the gate of a MOS transistor memory circuit element E1.

FIG. 3A illustrates a conventional interconnect in a memory device 40A consisting of an FECap ($C_{FE}$) a memory circuit element E1, and an interconnect 41a. A plate connection 43 (e.g., from the M1 metal layer) may be supplied thru a via 45 to FECap $C_{FE}$, which includes a top plate 46, a bottom plate 47, and a ferroelectric dielectric 48 therebetween. The exemplary interconnect 41a electrically couples $C_{FE}$ and circuit element E1 (e.g., the gate of a MOS transistor) thru a single interconnect structure (e.g., a via, plug, or contact), typically comprising one or more layers of conductive material and where needed, a diffusion barrier layer.

Figure 3C:
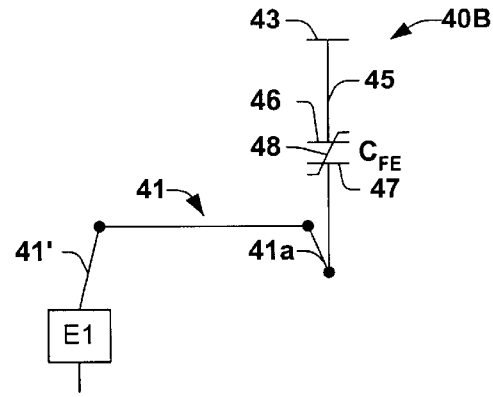
FIG. 3C is another prior art schematic diagram of a memory device illustrating an exemplary interconnection between an FECap ($C_{FE}$) and the gate of a MOS transistor memory circuit element E1.
Figure 3B:
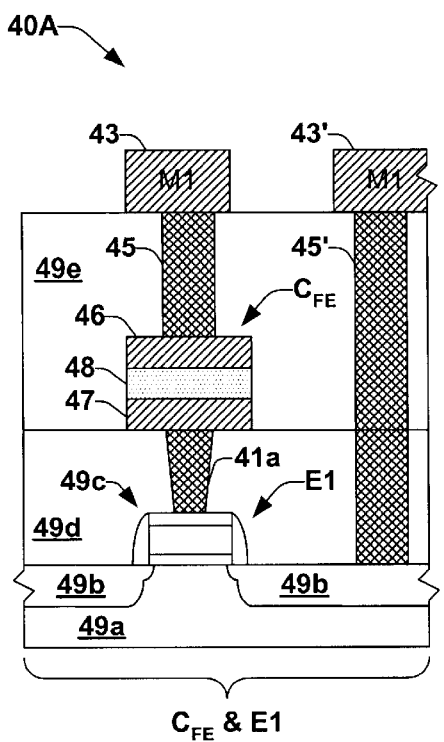
FIG. 3B is a fragmentary cross-sectional view of a partially fabricated memory device containing the FECap and transistor associated therewith of FIG. 3A, illustrating a prior art single interconnection structure for coupling directly between a ferroelectric capacitor $C_{FE}$ and a memory circuit element E1.

FIG. 3B further illustrates the fragmentary cross-sectional view of a partially fabricated prior art memory device 40A containing the FECap ($C_{FE}$) and a transistor associated therewith represented by the circuit element E1 of FIG. 3A. Memory device 40A also illustrates the exemplary single interconnect structure 41a of FIG. 3A comprising a via 41a used to couple the ferroelectric capacitor $C_{FE}$ and the memory circuit element E1.

Circuit element E1 is provided as an exemplary MOS transistor formed in a substrate 49a having active regions (e.g., source and drain regions) 49b, and a poly region (e.g., a gate, or gate region) 49c over the substrate 49a formed within a first interlevel dielectric (ILD) layer 49d of memory device 40A. The exemplary interconnect via 41a is formed within the first ILD layer 49d to electrically couple the gate 49c of transistor E1 to the ferroelectric capacitor $C_{FE}$. $C_{FE}$ comprises a bottom plate 47 formed with a conductive material (e.g., iridium or $Ir/IrO_2$ electrodes) over the first ILD layer 49d, a ferroelectric dielectric 48 (e.g., a thin lead zirconate titanate (PZT) ferroelectric material layer) overlying the bottom plate 47, and a top plate 46, also of a conductive material, formed overlying the ferroelectric dielectric 48.

After $C_{FE}$ is formed and etched to define a capacitor stack, $C_{FE}$ is coupled to the M1 metal layer 43 through a via 45, formed within a second ILD layer 49e overlying the capacitor stack $C_{FE}$.

FIG. 3B also shows a typical contact/via 45' coupling one of the active regions 49b of the circuit element E1 to another segment 43' of the M1 metal layer. Thus, although FIG. 3B illustrates a single short interconnect contact 41a, which directly couples the bottom plate 47 of the FECap $C_{FE}$ to the circuit element E1, only one circuit element is operably coupled to the FECap.

Figure 3D:
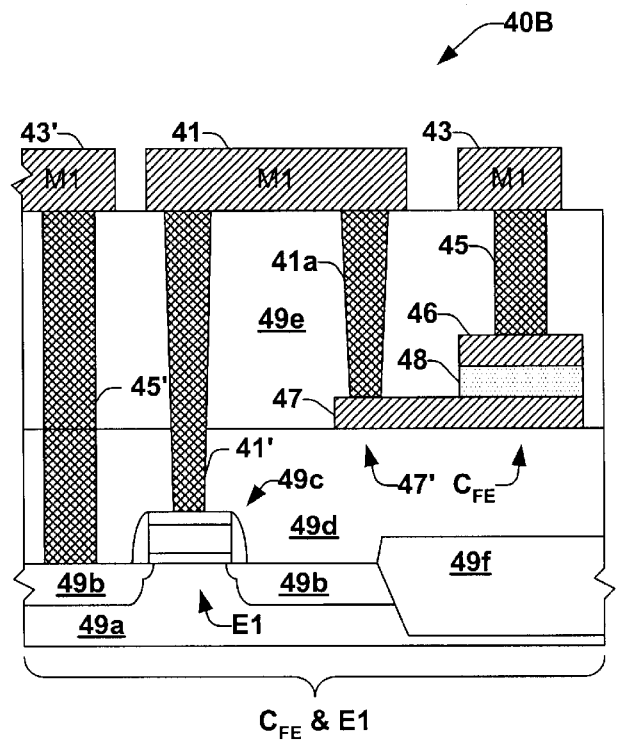
FIG. 3D is another fragmentary cross-sectional view of a partially fabricated memory device containing the FECap and transistor associated therewith of FIG. 3C, illustrating a prior art single interconnection structure between a ferroelectric capacitor $C_{FE}$ and a memory circuit element E1 coupled indirectly through the M1 layer and a via.

FIGS. 3C and 3D illustrate another conventional interconnect in a memory device 40B consisting of an FECap ($C_{FE}$) a memory circuit element E1, and a multi-segmented interconnect structure comprising (e.g., the three segments 41a, 41, and 41'). Electrically, memory device 40B is similar to memory device 40A of FIG. 3A and 3B, in that $C_{FE}$ is coupled electrically thru the interconnect structure to circuit element E1, and as such need not be described again in detail for the sake of brevity. By contrast, however, the FECap $C_{FE}$, of memory device 40B, includes a bottom plate 47, extended using extra mask and etch operations, to provide a plate extension region 47' for contact 41a. The exemplary multi-segmented interconnect further comprises two vias (41a and 41') which may both traverse greater distances than contact 41a of memory device 40A. This extra conductor length, in addition to the length of a segment 41 of the M1 metal layer, creates an increased interconnect resistance. Interconnect (41a, 41, and 41'), therefore, electrically couples $C_{FE}$ to a single circuit element E1 (e.g., the gate of a MOS transistor), indirectly thru three interconnect segments.

The multiple segments (41a, 41, and 41') of the interconnect of memory device 40B demonstrates a complex and relatively high resistance interconnection between the bottom plate 47 of the FECap $C_{FE}$ and the circuit element E1. In addition, memory device 40B has a capacitance, which is limited to the smaller surface area of the top plate 46 and may require additional processing operations. Thus, the illustrated prior art interconnect structures of FIGS. 3A–3D are unacceptable for the devices considered.

Figure 4A:
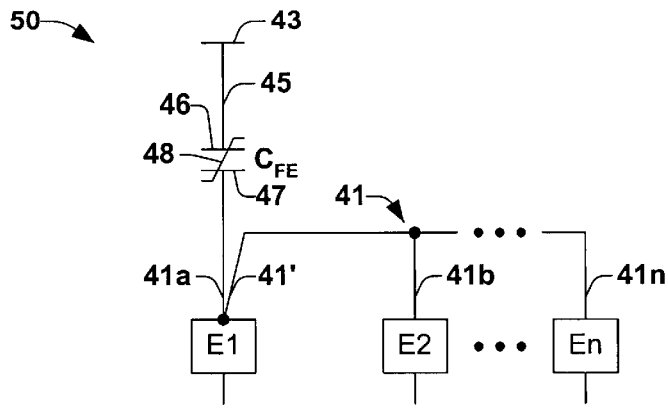
FIG. 4A is a prior art schematic diagram illustrating an exemplary interconnection between an FECap ($C_{FE}$) and several memory circuit elements E1–En of a memory device.
Figure 4B:
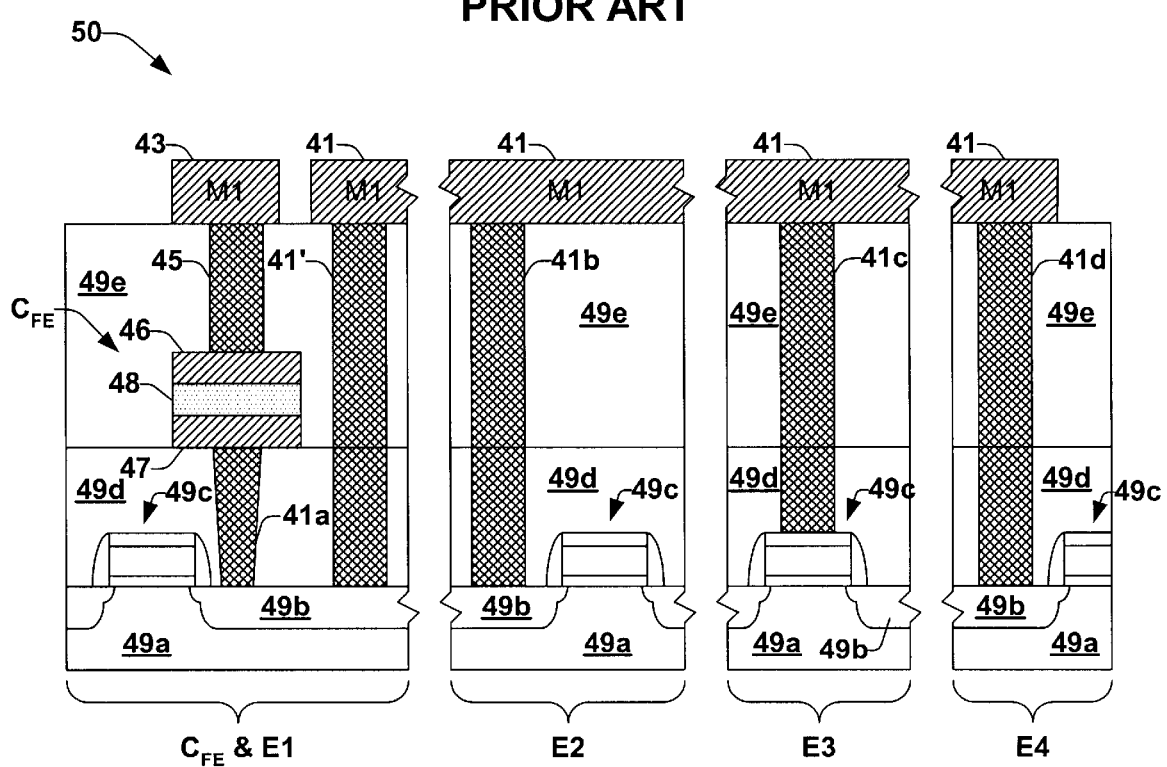
FIG. 4B is a fragmentary cross-sectional view of a partially fabricated memory device containing an FECap and transistors associated therewith and FIG. 4A, illustrating a prior art interconnection structure between a ferroelectric capacitor $C_{FE}$ and several memory circuit elements E1–E4 coupled indirectly through the M1 layer and vias.

FIGS. 4A and 4B illustrate another exemplary schematic and fragmentary cross-sectional view, respectively, of a partially fabricated memory device 50 containing a prior art interconnection between an FECap ($C_{FE}$) and several memory circuit elements E1–En. FIGS. 4A and 4B have similarities to those of FIGS. 3A–3D, using like numbering where possible, and as such, may not be fully described again for the sake of brevity.

Typically, as shown in memory device 50, when an FECap is to interconnect with multiple circuit elements, the interconnections are made centrally from an M1 metal layer. The M1 layer then couples to the multiple circuit elements through contacts associated with each element. The interconnect comprises a contact 41a from the bottom plate of $C_{FE}$ to a first element E1 in an active region 49b, and vias (41', 41b, 41c, 41d) coupling elements E1–E4 respectively to a common interconnect segment 41 in the M1 metal layer. The exemplary interconnect structure of memory device 50 electrically couples $C_{FE}$ and several memory circuit elements E1–E4 indirectly through the M1 layer, vias and a contact. FIGS. 4A and 4B further illustrate that a common connection is made at one element (e.g., E1, 49b), and then all other circuit element interconnections are made back up through the common interconnect of the M1 layer.

Thus, the M1 layer may tend to be congested in the prior art limiting the circuit density and the FECap surface area, due to the number of via and contact connections between the M1 and the active areas of the circuit elements E1–E4. The multiple interconnect segments (41a, 41', 41, 41b, 41c, and 41d) of the memory device 50, again demonstrate a complex and a relatively high resistance and high capacitance interconnection between the bottom plate 47 of the FECap $C_{FE}$ and the circuit elements E1–E4. In addition, the capacitance of $C_{FE}$ is still limited by the surface area of the plates 46/47 within the ILD layers 49d/49e, which is congested by the field of vias coupling the elements E1–E4 and the M1 layer. Thus, the illustrated prior art interconnect structure of FIGS. 4A–4B is also unacceptable for the devices considered requiring interconnection of multiple elements.

Figure 5A:
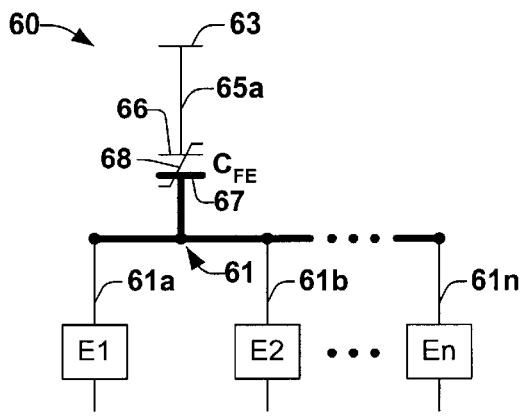
FIG. 5A is a schematic diagram illustrating an exemplary interconnection between an FECap ($C_{FE}$) and several memory circuit elements E1–En of a memory device in accordance with an aspect of the present invention.
Figure 5B:
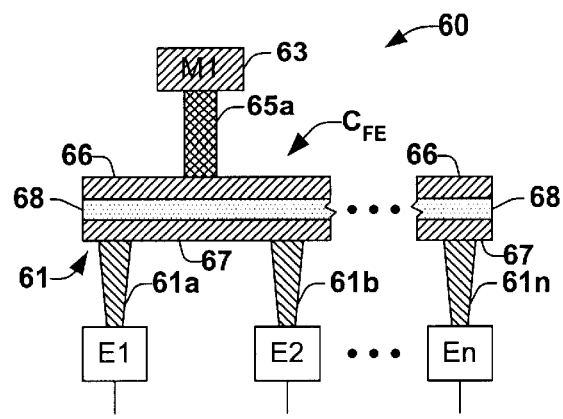
FIG. 5B is a fragmentary cross-sectional view of the partially fabricated memory device of FIG. 5A, comprising a ferroelectric capacitor FECap $C_{FE}$ and several memory circuit elements E1–En associated therewith, illustrating an exemplary local interconnection structure between $C_{FE}$ and the elements E1–En coupled directly to a conductive plate of $C_{FE}$ through vias in accordance with an aspect of the present invention.
Figure 5C:
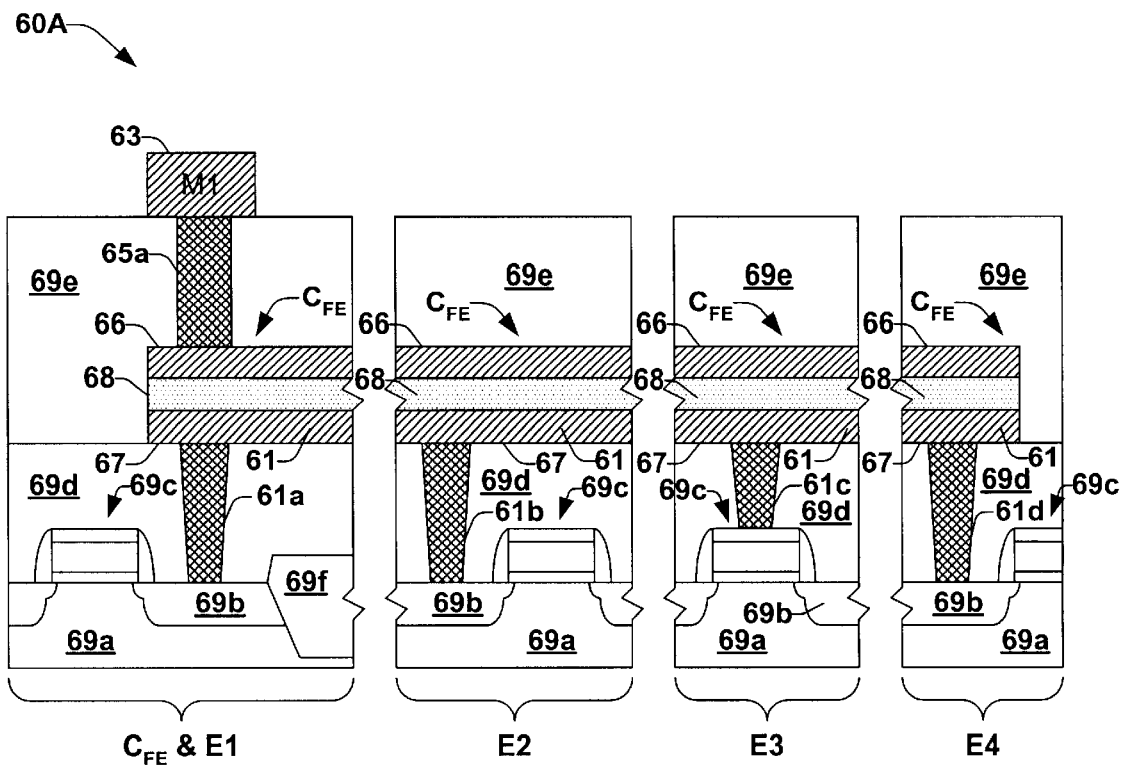
FIG. 5C is a fragmentary cross-sectional detailed view of the partially fabricated memory device of FIG. 5A and 5B, illustrating an exemplary interconnection structure, wherein a local interconnect layer is formed within a conductive plate of a ferroelectric capacitor $C_{FE}$ for interconnection between a ferroelectric capacitor $C_{FE}$ and several memory circuit elements E1–E4 in accordance with an aspect of the present invention.

FIGS. 5A–5C, illustrate schematic and fragmentary cross-sectional diagrams of a partially fabricated memory device of the present invention, wherein a local interconnect layer is formed within a conductive plate of a ferroelectric capacitor $C_{FE}$. FIGS. 5A and 5B illustrate the general case for interconnection between the FECap and a plurality of circuit elements E1–En in a memory device 60, and FIG. 5C for a more detailed view of one exemplary interconnection between the FECap and four specific circuit elements E1–E4 in a memory device 60A. FIGS. 5B and 5C illustrate local interconnections between $C_{FE}$ and active regions of the circuit elements (e.g., p-type, n-type, or polysilicon regions) E1–En (e.g., E1–E4 of device 60A), comprising, for example, a source, drain, or gate of a MOS transistor. Memory devices 60 and 60A, further illustrates that a conductive plate of $C_{FE}$ provides a local interconnect node (or interconnect layer) 61 for direct coupling to the circuit elements through corresponding contacts, rather than being routed indirectly through the M1 layer and vias.

A plate connection 63 (e.g., from the M1 metal layer) may be supplied thru a via 65a to a top plate 66 of FECap $C_{FE}$. FECap $C_{FE}$ includes the top plate 66, a bottom plate 67, and a ferroelectric dielectric 68 therebetween. One plate of the FECap (e.g., the bottom plate 67), forms the local interconnect layer 61 for electrically coupling $C_{FE}$ to a plurality of circuit element E1–En, thru a plurality of short contacts, or contacts (e.g., 61a–61n of device 60, or 61a–61d of device 60A) associated with each circuit element (e.g., E1–En of device 60, or E1–E4 of device 60A). Beneficially, the plate area may be increased as an integral part of this local interconnection layer 61 residing over and extending between the circuit elements.

For example, in FIG. 5C the circuit elements E1–E4 are formed in a substrate 69a having active regions (e.g., source and drain regions) 69b, and a poly region (e.g., a gate, or gate region) 69c over the substrate 69a formed within a first interlevel dielectric (ILD) layer 69d of memory device 60A. The plurality of vias (e.g., 61a–61d) are formed within a first ILD layer 69d overlying the plurality of circuit element E1–E4, which couple directly to the ferroelectric capacitor $C_{FE}$ through the plurality of vias. $C_{FE}$ comprises a capacitor stack of two conductive plates and a dielectric layer therebetween, overlying the first ILD layer 69d. The capacitor stack comprises the bottom plate 67 formed with a conductive material (e.g., iridium electrodes) over the first ILD layer 69d, the ferroelectric dielectric 68, for example, a thin lead zirconate titanate (PZT) ferroelectric material layer formed overlying the bottom plate 67, and the top plate 66, also of a conductive material, formed overlying the ferroelectric dielectric 68.

In accordance with one aspect of the invention, either conductive plate (e.g., the top plate 66, or the bottom plate 67) of the FECap may be used as a local interconnect to directly couple the plurality of circuit elements of the memory device together, as will be further appreciated.

Figure 6A:
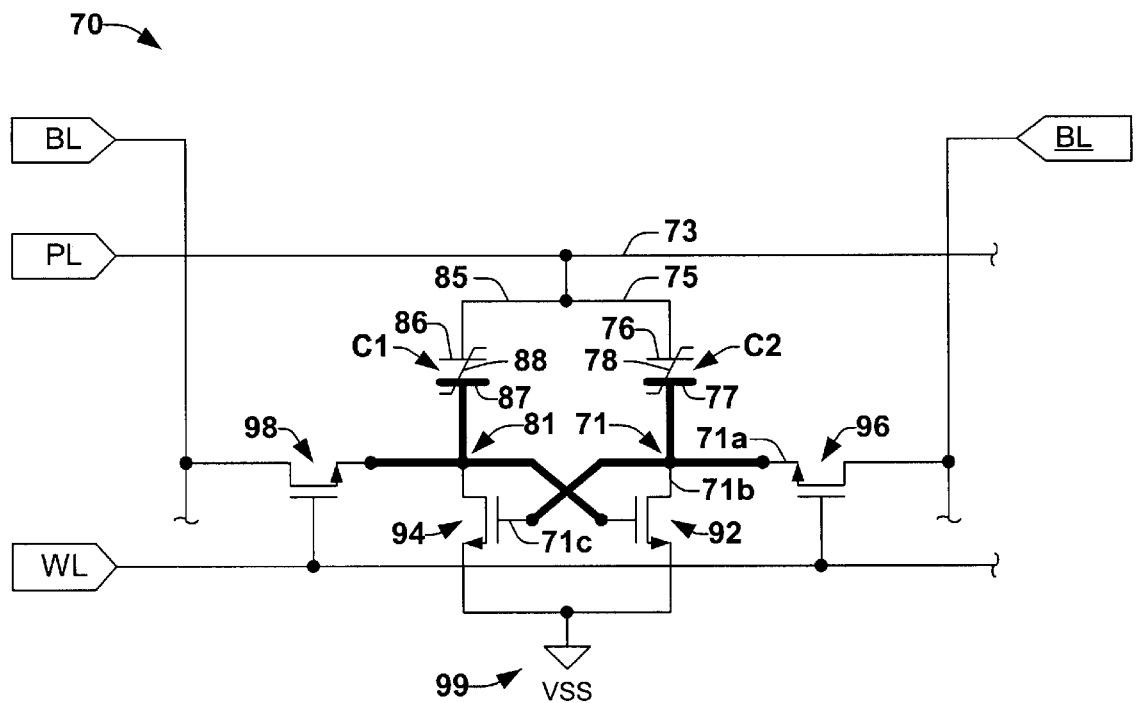
FIG. 6A is a schematic diagram illustrating another exemplary memory device having a non-volatile 4T–2C SRAM ferroelectric memory cell using two ferroelectric capacitors, each FECap coupled directly to three MOS transistor circuit elements using a conductive plate of the FECap in accordance with an aspect of the present invention.
Figure 6B:
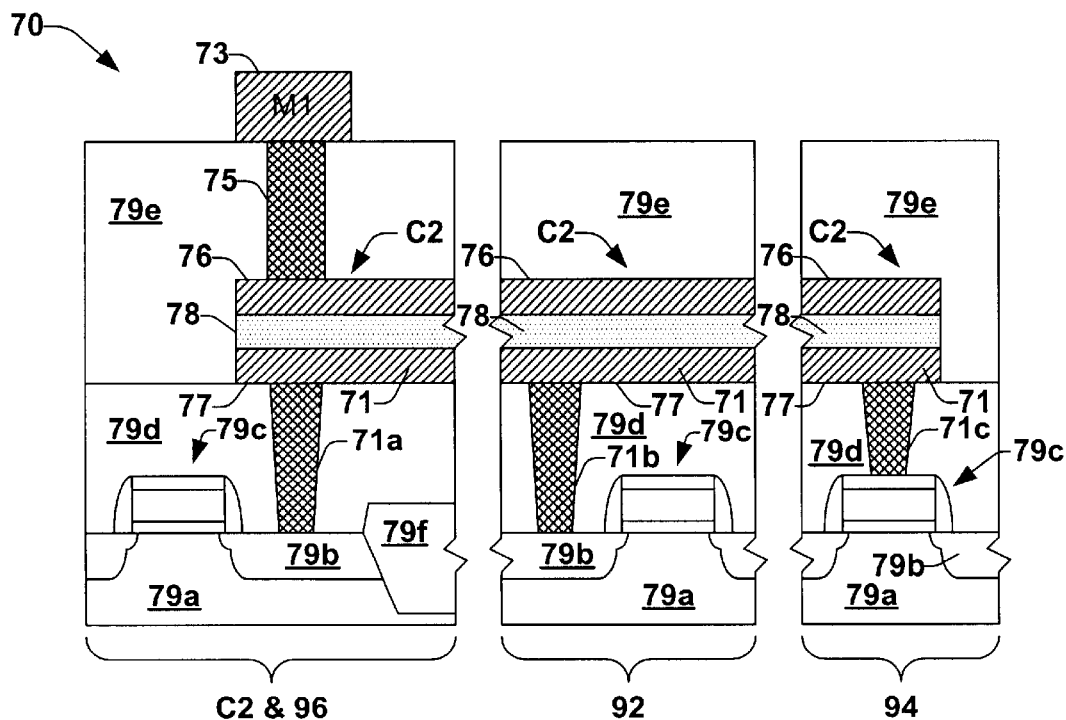
FIG. 6B is a fragmentary cross-sectional detailed view of the partially fabricated memory device of FIG. 6A, illustrating an exemplary interconnection structure, wherein a local interconnect layer is formed within a conductive plate of a ferroelectric capacitor $C_{FE}$ for interconnection between a ferroelectric capacitor C2 and three MOS transistor circuit elements in accordance with an aspect of the present invention.

FIGS. 6A, and 6B, illustrate a schematic and fragmentary cross-section diagram, respectively, of an exemplary non-volatile 4T-2C SRAM ferroelectric memory cell 70, in accordance with the present invention. Memory cell 70 uses two ferroelectric capacitors C1 and C2. Each FECap is coupled directly to three MOS transistor circuit elements using an interconnect comprising the conductive plate of an FECap. Interconnections for C1 and C2 in this example are identical, thus a description of one such interconnection will convey the concept in accordance with the present invention. For example, FECap C2 provides a node (e.g., 71 for C2, or 81 for C1) for direct local electrical interconnections (71a, 71b, 71c) between four circuit elements (e.g., C2, and three MOS transistors 92, 94, and 96) using a conductive plate (e.g., 77) of FECap C2, without utilizing another metal layer such as the M1 layer.

FIG. 6B further details the exemplary interconnection structure of the partially fabricated memory device 70 of FIG. 6A, which are similar in many respects to that of FIGS. 5A and 5C, and as such need not be described again in detail for the sake of brevity.

Thus, in the exemplary ferroelectric memory device of SRAM ferroelectric memory cell 70, two ferroelectric capacitors are used, with each FECap coupled directly to three MOS transistor circuit elements using a conductive plate of the FECap. A local interconnect layer is formed with the conductive plate of the ferroelectric capacitor (e.g., C2) for interconnection between the FECap and two or more circuit elements (e.g., three MOS transistors) in accordance with an aspect of the present invention.

The SRAM cell 70 includes two NMOS coupling transistors 94 and 92, which are cross-coupled to FECaps C2 and C1 respectively, for coupling C1 and C2, respectively, to $V_{SS}$. C1 and C2 are accessed from complementary bitlines BL and $\overline{BL}$, respectively, by two NMOS access transistors 96 and 98, wherein the gates of the access transistors 96 and 98 are coupled to, and enabled by a wordline WL. The upper terminals of C1 and C2 are coupled to a single plateline signal PL (73). Internal SRAM nodes 71 and 81 are cross-coupled between coupling transistors 94 and 92, and FECaps C2 and C1 respectively, with the node 81 coupled with the gate of transistor 92 and the source of transistor 98, and the node 71 coupled with the gate of transistor 94 and the source of transistor 96.

In contrast to prior art ferroelectric memory devices, as discussed previously, the FECap surface area available for C2 may be increased in this scheme, due to the elimination of the surface area conventionally required by the contact/vias between the M1 layer and active regions of the substrate. Further, the overall length of the interconnection vias (e.g., 71a, 71b, 71c), are shorter in this structure relative to a conventional scheme, permitting decreased overall interconnect resistance and capacitance, and increased memory device speed. In addition, M1 thereover is available for other routing needs, thereby improving layout flexibility.

This SRAM memory cell is adapted to store a binary non-volatile data state. However, the purpose, operations and functions of the SRAM and other such memory cells is well known and as such, is outside the scope of the present invention, except to provide an exemplary implementation of a memory device incorporating a local interconnect structure in accordance with the present invention.

Figure 7:
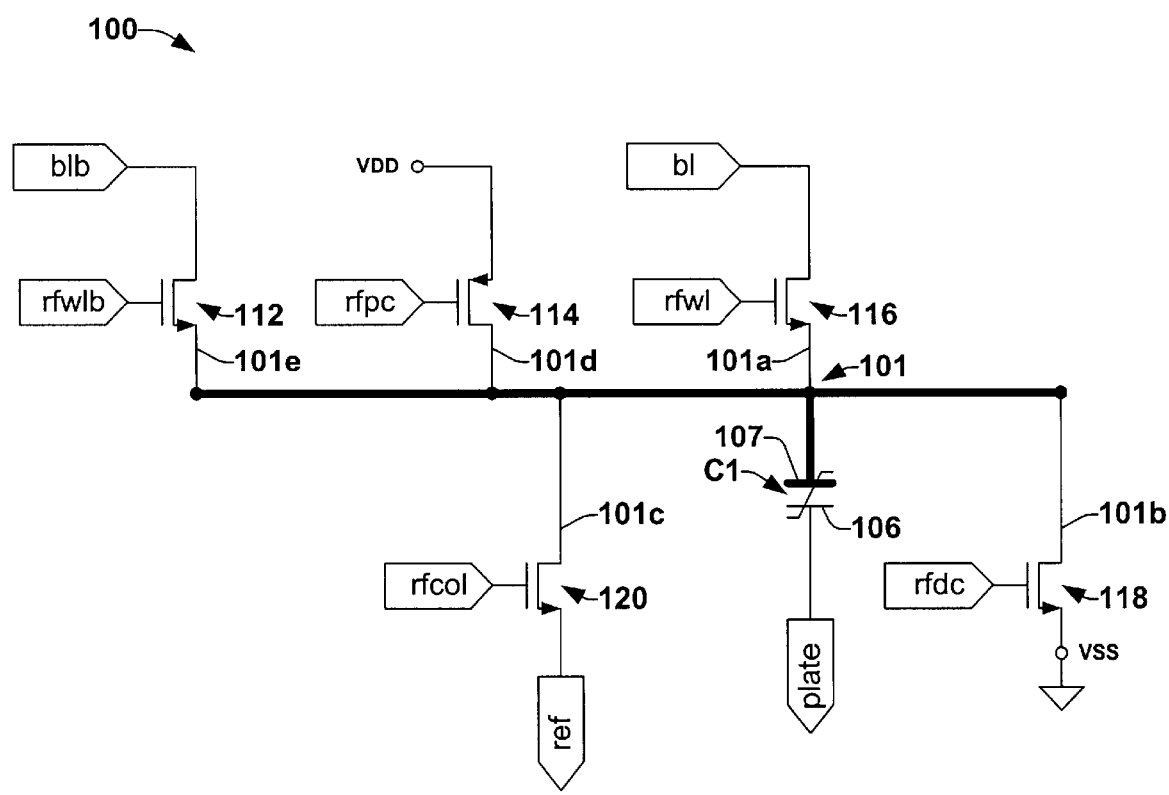
FIG. 7 is a schematic diagram of a non-volatile reference cell, illustrating another exemplary ferroelectric memory device, wherein a ferroelectric capacitor directly couples five MOS transistor circuit elements using a conductive plate of the FECap in accordance with an aspect of the present invention.

Referring now to FIG. 7, an exemplary non-volatile reference cell 100 is illustrated for storing a reference voltage in a ferroelectric memory device. The memory device 100 comprises a ferroelectric capacitor C1, five MOS transistor circuit elements, and a local interconnect structure 101 for coupling the circuit elements directly to C1. C1 comprises a ferroelectric capacitor stack having a top conductive plate 106 and a bottom conductive plate 107, with a ferroelectric dielectric material disposed therebetween. Local interconnect structure 101 further comprises five single contacts (e.g., 101a–101e) which are individually in contact with a respective MOS transistor circuit element and the bottom conductive plate 107 of C1.

As with the examples of FIGS. 5A–5C, and 6A–6B, FIG. 7 illustrates a conductive plate of the FECap used as an interconnection structure (e.g., 101) to directly couple between the five exemplary circuit elements (e.g., NMOS transistors 112, 114, 116, 118, 120) of the memory device 100 in accordance with an aspect of the present invention. The conductive plate of C1 is further operable to conduct the circuit currents between the various circuit elements and to provide ferroelectric capacitor plate functions. Further, by eliminating the need for additional vias to a metal layer (e.g., the M1 metal layer), the FECap surface area may be increased to accommodate the conduction paths ordinarily used by the metal layer to provide both interconnection and FECap plate functions.

Therefore, the reference cell 100, according to an aspect of the invention provides a device, comprising an FECap based reference cell including an FECap coupled to a plate line and a reference node, a "blb" access transistor 112 coupled to a "blb" terminal, a "rfwlb" access input and the reference node 101e, a drain coupling transistor 114 coupled to a supply voltage $V_{DD}$, a "rfpc" access input and the reference node 101d. The reference cell also comprises an "rfdc" access transistor 118 coupled to a source terminal $V_{SS}$, an "rfdc" access input and the reference node 101b, an "rfwl" access transistor 116 coupled to a "bl" terminal, an "rfwl" access input and the reference node 101a. The reference cell further comprises a reference "ref" transistor 120 coupled to a "ref" input terminal, a "rfcol" access input and the reference node 101c adapted to store and supply a reference voltage from the ferroelectric capacitor C1 to the "bl" or "blb" outputs for various memory functions.

One aspect of the invention provides a method for forming a ferroelectric capacitor integrally with an interconnection structure of an FERAM memory device. The FERAM device comprises a plurality of circuit elements associated with the FERAM memory device and a plurality of contacts formed over the circuit elements and through openings in a first ILD layer overlying the plurality of circuit elements and coupled thereto, respectively. The method also includes forming a ferroelectric capacitor stack extending over the plurality of contacts formed over the plurality of circuit elements. The forming of the stack comprises forming a bottom electrode layer (e.g., a conductive plate), a ferroelectric dielectric layer, a top electrode layer (e.g., another conductive plate), and a hard mask over the first ILD layer and the plurality of contacts associated with the circuit elements, and patterning the hard mask layer extending over the capacitor stack.

The FECap formation method further includes selectively etching the top electrode layer, the ferroelectric dielectric layer, and the bottom electrode layer using the hard mask to define the shape and size of the capacitor stack residing over the first ILD layer, where the stack extends between and to the plurality of contacts and provides local electrical coupling between the plurality of circuit elements of the device through the plurality of contacts that are in direct contact with the FECap and with respective circuit elements of the plurality of circuit elements.

The FECap thus formed, is operably adapted as the primary interconnection layer between multiple circuit elements to provide a local interconnect function with greater FECap surface area, yet with shorter total interconnection lengths, resistances and capacitance than some prior art devices. Further, the FECap memory device of the inventive method reduces interconnection crowding of the existing metal layers (e.g., the M1 layer), providing reduced layout areas while requiring no additional device processing operations. These and other benefits will become more apparent as the following figures are described.

An exemplary method of forming an FeRAM capacitor in accordance with the present invention which is similar in many respects to the capacitor $C_{FE}$ of FIGS. 5A–5C, will now be discussed in conjunction with FIG. 8, wherein a method 200 of forming an FeRAM capacitor with an integral interconnection structure is disclosed.

While the method 200 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The method 200 comprises forming a ferroelectric capacitor with an integral interconnection structure in an FERAM memory device. Initially, standard front end processing may proceed conventionally. Then, beginning at 202, the method 200 comprises providing a plurality of circuit elements (e.g., E1–En, or the sources and drains 69b and the gates 69c of FIGS. 5A–C) associated with the ferroelectric memory device in a semiconductor material (e.g., substrate 69a of FIG. 5C). At 204 a first interlayer dielectric layer (e.g., ILD 69d of FIG. 5C) is formed overlying the plurality of circuit elements and a plurality of contacts, for example, tungsten (W) contacts 61a–61n of FIGS. 5A–C are formed therein over the circuit elements and coupled thereto, respectively, through openings in the first interlayer dielectric layer 69d.

Formation of the first interlayer dielectric layer 69d and the contacts 61a–61n may be formed by various means and any such process is contemplated as falling within the scope of the present invention. Then the FeRAM capacitor(s) are formed over the interlayer dielectric 69d and the contacts 61a–61n, as illustrated in FIG. 5C and described in greater detail below.

At 206 a bottom electrode layer 67 of the FECap $C_{FE}$ is formed with a conductive material (e.g., iridium or Ir/IrO$_2$ electrodes) extending over the first ILD layer, the plurality of contacts associated with the circuit elements, and the entire wafer. The bottom electrode layer 67 is further formed in contact with the plurality of contacts 61a–61n that are formed in contact with respective circuit elements E1–En of the device. Thus, in one exemplary aspect of the invention, the bottom electrode layer 67 of the FECap $C_{FE}$ provides a local interconnection layer 61 between the FECap $C_{FE}$ and the plurality of circuit elements E1–En.

At 208 a ferroelectric dielectric layer 68, for example, a thin lead zirconate titanate (PZT) ferroelectric material layer is formed overlying the bottom plate 67 of the FECap and the entire wafer.

At 210 second conductive plate (e.g., a top electrode layer) 66 of the FECap $C_{FE}$ is formed with a conductive material (e.g., iridium or Ir/IrO$_2$ electrodes) overlying the ferroelectric dielectric layer 68, the bottom electrode layer 67, and the entire wafer.

At 212 a hard mask (e.g., an oxynitride material layer, not shown) is formed over the top electrode layer 66, the ferroelectric dielectric layer 68, and the bottom electrode layer 67. The hard mask is patterned to define one or more capacitor stacks and one stack has a dimension that overlies the plurality of contacts 61a–61n that are formed in contact with respective circuit elements E1–En of the device. The method may then continue by selectively etching the top electrode layer, the ferroelectric dielectric layer, and the bottom electrode layer using the patterned hard mask to pattern or define the shape and size of a capacitor stack residing over the first ILD layer. Formed in this manner, the capacitor stack extends over the plurality of contacts 61a–61n, providing direct local interconnection between the FECap and the plurality of circuit elements E1–En of the device, through the plurality of contacts 61a–61n that are in direct contact with the FECap $C_{FE}$ and respective circuit elements of the plurality of circuit elements E1–En.

At 250, a second interlevel dielectric layer 69e is formed over the defined capacitor stack of FECap $C_{FE}$. A via 65a may be formed by patterning, etching, and deposition of a conductive material through openings in the interlevel dielectric layer 69e to contact the top electrode layer 66 of the FECap $C_{FE}$. A metal layer (e.g., the M1 layer) 63 is then formed over the via 65a as a plate connection to the top electrode 66 of the FECap and as the traditional interconnection layer to other such FECaps or devices.

Thereafter, method 200 ends and standard back end processing may continue as usual to complete the memory device.

Figure 8:
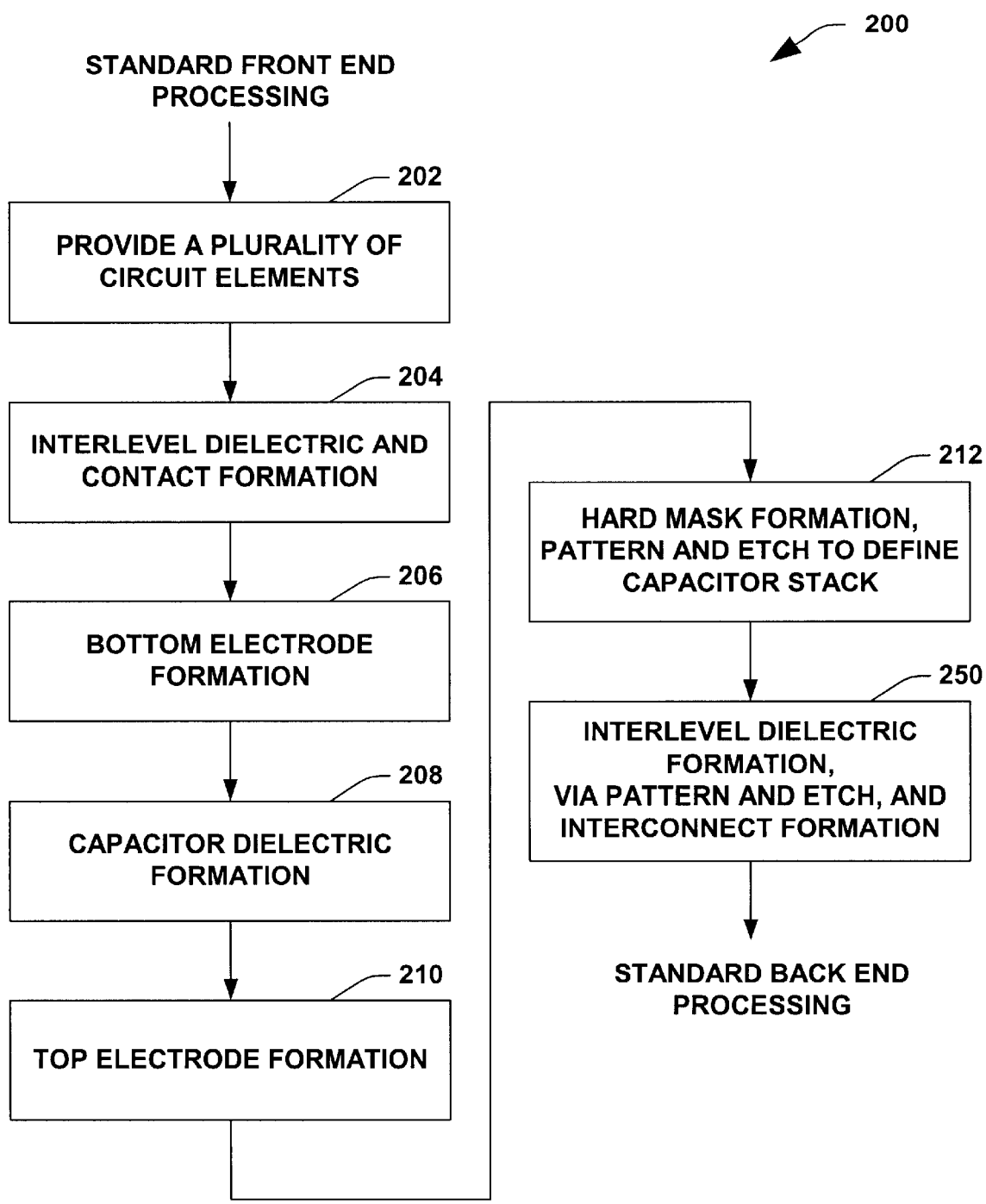
FIG. 8 is a flow chart diagram illustrating a method of forming a ferroelectric capacitor in a ferroelectric memory device in accordance with the present invention.
Figure 9:
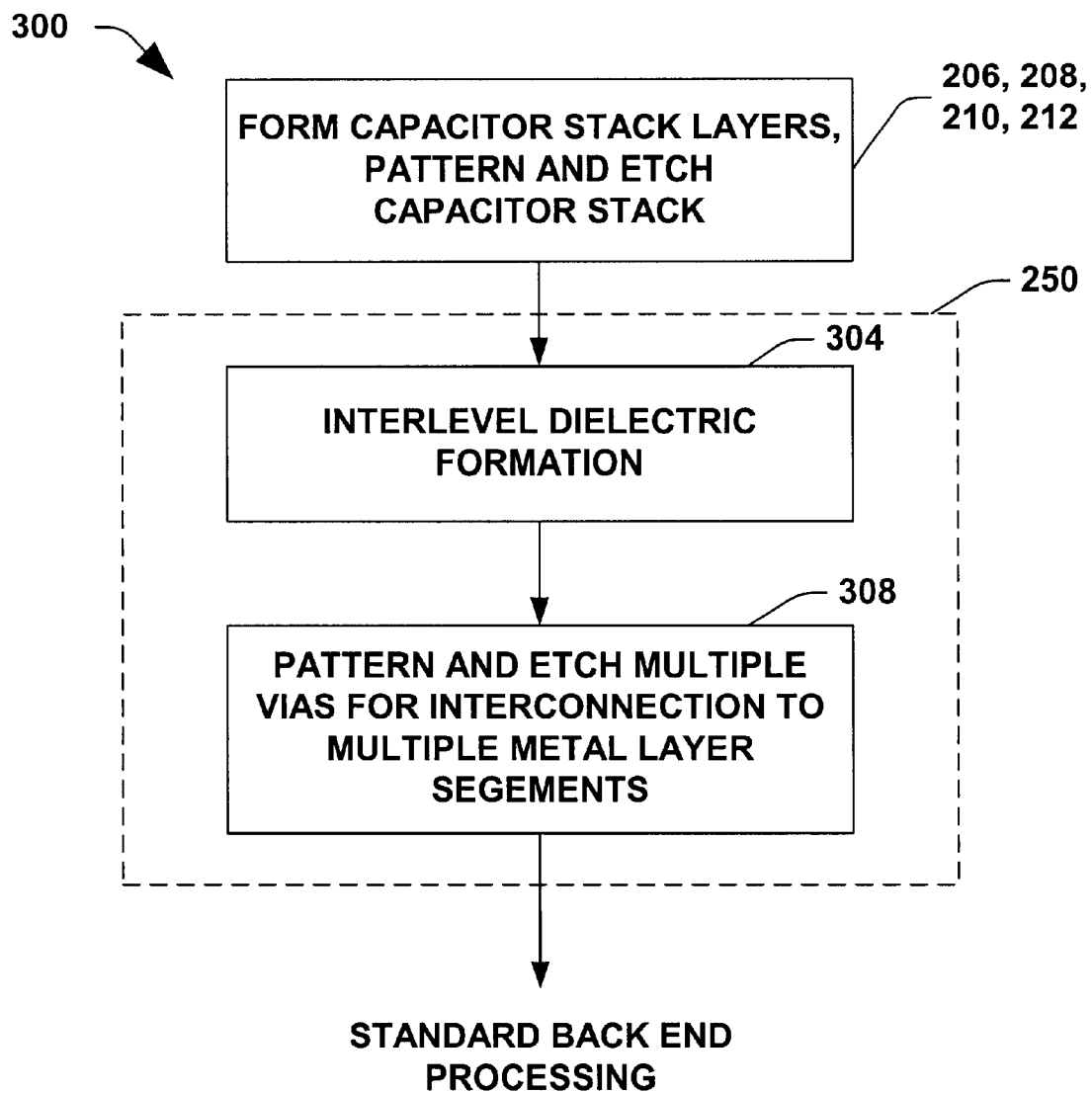
FIG. 9 is a flow chart diagram illustrating a method of forming a multi-segment, or multi-layer interconnect structure in accordance with FIG. 8 and the present invention.
Figure 10C:
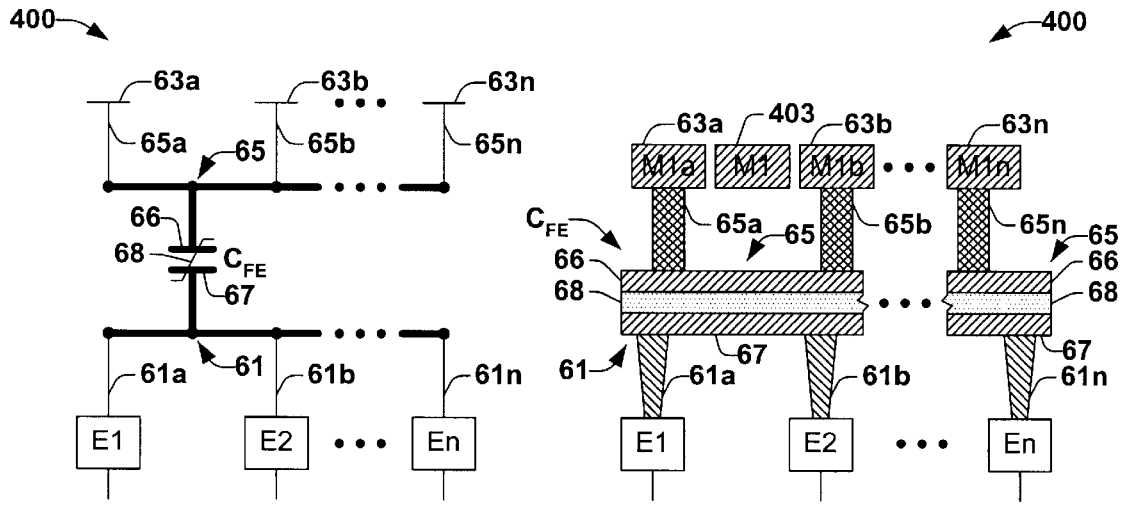
FIG. 10C is a fragmentary cross-sectional detailed view of the partially fabricated memory device of FIG. 10A and 10B, illustrating an exemplary interconnection structure, wherein first and second local interconnect layers are formed within first and second conductive plates respectively of a ferroelectric capacitor $C_{FE}$ for interconnection between the first conductive plate and a plurality of memory circuit elements E1–E4 through a plurality of vias, and between the second conductive plate and a plurality of segments M1a–M1n of a metal layer and a plurality of contacts associated therewith in accordance with an aspect of the present invention.
Figure 10C:
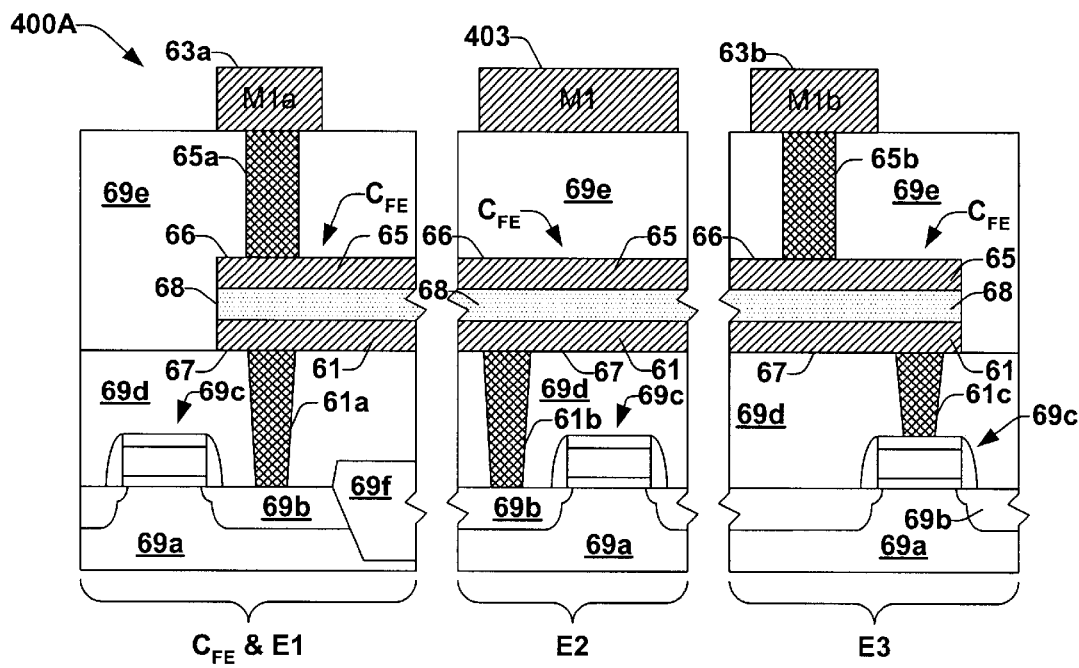

FIG. 9, illustrates a further aspect 300 of the method 200 of FIG. 8, while FIGS. 10A–10C illustrate a further aspect of the FECap and interconnection structures of FIGS. 5A–5C, wherein FIGS. 10A–10C of device 400 and 400A are similar to that of FIGS. 5A–5C of device 60 and 60A, and as such need not be fully described again for the sake of brevity.

Referring to FIG. 9, a further aspect 300 of the method 200 of FIG. 8 is illustrated, wherein after the formation and definition of the capacitor stack of 206, 208, 210, and 212, and the formation of the second interlevel dielectric layer 69e at 304, two or more vias 65a–65n may be patterned, etched, and formed at 308 for coupling two or more respective segments (e.g., 63a–63n of FIG. 10A–10C) of a metal layer (e.g., the M1 layer 63 of FIGS. 5A–C) providing an extra local interconnect layer using the top electrode layer 66. The metal layer 63 or metal layer segments 63a–63n are then formed over the vias 65a–65n as a plate connection to the top electrode 66 of the FECap in accordance with the present invention. Thus, in much the same way that the bottom electrode of the FECap may be used as a local interconnect layer for circuit elements, the top electrode layer may be used as a local interconnect layer for various segments of a metal layer. Thereafter, method 300 ends and standard back end processing may continue as usual to complete the memory device.

In one example of device 400A of FIG. 10C, according to an aspect of the invention, the top electrode 66 of FECap $C_{FE}$ is used as a local interconnect layer to join to segments 63a and 63b of the M1 metal layer, for example, to bypass around an unrelated M1 metal layer segment 403.

Although the FECap bottom electrode has been illustrated and described with respect to use as a local interconnect layer for a plurality of circuit elements, and the top electrode for a local interconnect layer for a plurality of metal layer segments or a plurality of segments from a plurality of metal layers, either top or bottom electrodes are anticipated as possible local interconnection layers between multiple circuit elements, between multiple segments of one or more metal layers, or between combinations thereof, and as such are contemplated as falling within the scope of the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A ferroelectric device, comprising:
   first and second circuit elements associated with the ferroelectric device; and
   a ferroelectric capacitor having first and second conductive plates residing over a first interlayer dielectric layer that overlies the first and second circuit elements, wherein the first conductive plate of the ferroelectric capacitor extends between the first and second circuit elements, wherein the first circuit element couples to the conductive plate directly through a first contact that is in contact with the first conductive plate, and a second circuit element couples to the conductive plate directly through a second contact that is in contact with the first conductive plate, and wherein the conductive plate of the ferroelectric capacitor electrically couples together the circuit elements of the device, and
   wherein the second conductive plate extends between multiple, laterally electrically insulated metal segments of an overlying metal layer, and wherein the metal segments are coupled to the second conductive plate through a respective contact, thereby electrically coupling together the metal segments.

2. The ferroelectric device of claim 1, wherein the first and second conductive plates of the ferroelectric capacitor have about the same surface area.

3. The ferroelectric device of claim 1, wherein one of the first and second circuit elements is an active circuit element comprising one of a p-type doped source/drain region of a transistor, an n-type doped source/drain region of a transistor, and a polysilicon gate region of a transistor associated with the ferroelectric device.

4. The ferroelectric device of claim 1, wherein one of the first and second circuit elements is an active circuit element of a MOS transistor comprising one of a source, a drain, and a gate.

5. A ferroelectric device, wherein the device comprises an SRAM cell comprising:

first and second coupling transistors;

first and second access transistors;

first and second bitlines;

a wordline;

first and second ferroelectric capacitors, each having first and second conductive plates residing over a first interlayer dielectric layer that overlies the coupling transistors and access transistors, wherein the second conductive plate of the first and second ferroelectric capacitors form a first node, and the first conductive plate of the first ferroelectric capacitor extends over a gate portion of the second coupling transistor, a drain portion of the first coupling transistor, and a source portion of the first access transistor, and couples thereto, respectively, directly through a first set of contacts, wherein the first conductive plate of the second ferroelectric capacitor extends over a gate portion of the first coupling transistor, a drain portion of the second coupling transistor, and a source portion of the second access transistor, and couples thereto, respectively, directly through a second set of contacts;

wherein the first node of the first and second ferroelectric capacitors is coupled to a plateline signal, and the second node of the first ferroelectric capacitor is coupled to a drain of the first coupling transistor and a source of the first access transistor through one or more of the first set of contacts, and the second node of the second ferroelectric capacitor is coupled to a drain of the second coupling transistor and a source of the second access transistor through one of the second set of contacts;

the second node of the first ferroelectric capacitor is also coupled to a gate of the second coupling transistor through one of the first set of contacts, and the second node of the second ferroelectric capacitor is also coupled to a gate of the first coupling transistor through one of the second set of contacts;

a source of the first and second coupling transistors is coupled to a ground, a drain of the first access transistor is coupled to a first bitline, and the drain of the second access transistor is coupled to a second bitline; and a gate of the first and second access transistor is coupled to the wordline;

wherein the first and second access transistors are operable to couple a data state output of the first and second ferroelectric capacitors to the first and second bitlines according to the wordline signal when a supply level voltage is applied to plate line.

6. A ferroelectric device, comprising:

first and second circuit elements associated with the ferroelectric device; and a ferroelectric capacitor having first and second conductive plates residing over a first interlayer dielectric layer that overlies the first and second circuit elements, wherein the first conductive plate of the ferroelectric capacitor extends between the first and second circuit elements, wherein the first circuit element couples to the conductive plate directly through a first contact that is in contact with the first conductive plate, and a second circuit element couples to the conductive plate directly through a second contact that is in contact with the first conductive plate, and wherein the conductive plate of the ferroelectric capacitor electrically couples together the circuit elements of the device, wherein the device comprises a reference cell comprising a ferroelectric capacitor and first and second transistors.

7. A ferroelectric device, comprising:

a plurality of circuit elements associated with the ferroelectric device;

a first interlayer dielectric layer overlying the circuit elements, the first interlayer dielectric layer having a plurality of conductive vias therein associated with the plurality of circuit elements and extending down thereto, respectively; and a ferroelectric capacitor having a first conductive plate residing over the first interlayer dielectric layer, wherein the first conductive plate of the ferroelectric capacitor extends between and couples to the plurality of conductive vias, wherein a plurality of the circuit elements are coupled together directly through the first conductive plate and the plurality of vias that are individually in contact with the conductive plate and a respective circuit element of the device, the ferroelectric capacitor having a second conductive plate that extends along multiple, laterally electrically isolated overlying conductive segments, wherein the second conductive plate electrically couples to at least two of the conductive segments directly through, respective contacts.

* * * * *